United States Patent
Zhang et al.

(10) Patent No.: US 9,936,407 B2
(45) Date of Patent: Apr. 3, 2018

(54) METHOD OF POSITIONING PROBLEM REGIONS COVERED WITH INDOOR WIRELESS NETWORK

(71) Applicant: RANPLAN WIRELESS NETWORK DESIGN LTD, Cambridge (GB)

(72) Inventors: Jie Zhang, Luton (GB); Chunxia Qin, Jinan (CN); Joyce Wu, Luton (GB); Hui Song, Hertford (GB)

(73) Assignee: RANPLAN WIRELESS NETWORK DESIGN LTD, Cambridge (GB)

(*) Notice: Subject to any disclaimer, the term of this patent is extended or adjusted under 35 U.S.C. 154(b) by 0 days.

(21) Appl. No.: 15/108,266

(22) PCT Filed: Dec. 24, 2014

(86) PCT No.: PCT/GB2014/053845
§ 371 (c)(1),
(2) Date: Jun. 24, 2016

(87) PCT Pub. No.: WO2015/097480
PCT Pub. Date: Jul. 2, 2015

(65) Prior Publication Data
US 2016/0337888 A1    Nov. 17, 2016

(30) Foreign Application Priority Data
Dec. 24, 2013    (CN) .......................... 2013 1 0724059

(51) Int. Cl.
*H04W 16/20*    (2009.01)
*H04B 1/707*    (2011.01)
(Continued)

(52) U.S. Cl.
CPC .......... *H04W 24/08* (2013.01); *G01S 5/0252* (2013.01); *G06F 17/11* (2013.01);
(Continued)

(58) Field of Classification Search
CPC ..... H04W 16/20; H04W 24/06; H04W 64/00; H04W 88/08; H04W 84/12; H04B 1/707; H04B 17/318; G01S 5/0252
See application file for complete search history.

(56) References Cited

U.S. PATENT DOCUMENTS

2004/0236547 A1    11/2004    Rappaport et al.
2005/0265321 A1    12/2005    Rappaport et al.
(Continued)

FOREIGN PATENT DOCUMENTS

CN    101431764 A    5/2009
CN    101547506 A    9/2009
(Continued)

OTHER PUBLICATIONS

Fang et al., "Dynamic Fingerprinting Combination for Improved Mobile Localization," IEEE Transactions on Wireless Communications; vol. 10, No. 12; Dec. 1, 2011; pp. 4018-4022.
(Continued)

*Primary Examiner* — Kamran Afshar
*Assistant Examiner* — Minjung Kim
(74) *Attorney, Agent, or Firm* — Mintz Levin Cohn Ferris Glovsky and Popeo, P.C.

(57) ABSTRACT

Method of positioning blind coverage regions in an indoor wireless network. The method comprises the following steps: constructing an indoor and outdoor combined three-dimensional spatial structural model of a target scene; recording and storing information of wireless access equipment which can be received by the target scene, both from the indoor wireless network and from an outdoor (e.g., cellular) network with overlapping coverage; establishing a wireless fingerprint database of the target building covering both the indoor and the outdoor wireless networks; when loss of coverage is detected, the UE handing over to the
(Continued)

outdoor network to transmit a measurement report from which the outdoor network can derive the UE's position (e.g., through triangulation); deriving the UE's position in the indoor area by superimposing the obtained information on the fingerprinting database (by analyzing only those cell-Id's that appear on the MR) and interpolating the result (mean square error); if the obtained position is covered by the fingerprinting database (i.e., it is in the indoor area), determining that the position corresponds to a blind coverage area inside the indoor wireless area; otherwise, assuming that the UE has left the building and a normal handover has taken place.

10 Claims, 7 Drawing Sheets

(51) Int. Cl.
| | |
|---|---|
| *H04W 24/06* | (2009.01) |
| *H04W 64/00* | (2009.01) |
| *H04W 24/08* | (2009.01) |
| *H04W 36/14* | (2009.01) |
| *G06F 17/11* | (2006.01) |
| *G06F 17/30* | (2006.01) |
| *G06F 17/50* | (2006.01) |
| *G06T 15/06* | (2011.01) |
| *G06T 17/05* | (2011.01) |
| *H04W 24/02* | (2009.01) |
| *G01S 5/02* | (2010.01) |
| *H04W 36/00* | (2009.01) |
| *H04W 84/12* | (2009.01) |
| *H04W 24/10* | (2009.01) |
| *H04W 36/04* | (2009.01) |

(52) U.S. Cl.
CPC .... *G06F 17/30589* (2013.01); *G06F 17/5004* (2013.01); *G06T 15/06* (2013.01); *G06T 17/05* (2013.01); *H04W 16/20* (2013.01); *H04W 24/02* (2013.01); *H04W 36/14* (2013.01); *H04W 64/00* (2013.01); *G06T 2210/61* (2013.01); *H04W 24/10* (2013.01); *H04W 36/0061* (2013.01); *H04W 36/04* (2013.01); *H04W 84/12* (2013.01)

(56) References Cited

U.S. PATENT DOCUMENTS

| | | | |
|---|---|---|---|
| 2008/0057873 A1* | 3/2008 | Huang | H04W 16/20 455/67.11 |
| 2011/0311436 A1 | 12/2011 | Yura et al. | |
| 2013/0337824 A1 | 12/2013 | Meredith et al. | |
| 2014/0213298 A1 | 7/2014 | Marti et al. | |
| 2015/0011239 A1* | 1/2015 | Quan | H04W 24/10 455/456.1 |

FOREIGN PATENT DOCUMENTS

| | | |
|---|---|---|
| CN | 101883424 A | 11/2010 |
| CN | 102143511 A | 8/2011 |
| CN | 102480678 A | 5/2012 |
| CN | 202231869 U | 5/2012 |
| CN | 202940968 U | 5/2013 |
| CN | 103369549 A | 10/2013 |
| CN | 103440473 A | 12/2013 |
| WO | WO-2011/067466 A1 | 6/2011 |

OTHER PUBLICATIONS

Sun et al., "Signal Processing Techniques in Network-Aided Positioning," IEEE Signal Processing Magazine; vol. 22, No. 4; Jul. 1, 2005; pp. 12-23.

International Search Report dated Apr. 21, 2015 for PCT Application No. PCT/GB2014/053845, filed Dec. 24, 2014, 5 pages.

Chunxia Qin, Dayang Liu, Zhihua Lai, and Jie Zhang. "Analys and Solution for WLAN Wireless Interference Based on Ranplan iBuildNet.", Telecommunications Technology, issue 9, 2011. pp. 127-131. www.ttm.com.cn.

Fortune, Steven, "A Bream-Tracing Algorithm for Prediction of Indoor Radio Propagation," Applied Computational Geometry Towards Geometric Engineering, Springer Berlin Heidelberg, May 27, 1996, pp. 157-166.

International Search Report dated Apr. 8, 2015 for PCT Application No. PCT/GB2014/053848, filed Dec. 24, 2014, 5 pages.

The State Intellectual Property Office of China First Notification of Office Action and Search Report issued in Chinese Patent Application No. 201310721807.X, dated Mar. 31, 2016. 8 pages. [Chinese language].

The State Intellectual Property Office of China First Notification of Office Action and Search Report issued in Chinese Patent Application No. 201310721807.X, dated Mar. 31, 2016. 11 pages. [English language translation].

The State Intellectual Property Office of China First Notification of Office Action and Search Report issued in Chinese Patent Application No. 201310724059.0, dated Feb. 6, 2016. 6 pages. [Chinese language].

The State Intellectual Property Office of China First Notification of Office Action and Search Report issued in Chinese Patent Application No. 201310724059.0, dated Feb. 6, 2016. 11 pages. [English language translation].

* cited by examiner

METHOD OF POSITIONING PROBLEM REGIONS COVERED WITH INDOOR WIRELESS NETWORK

CROSS-REFERENCE TO RELATED APPLICATIONS

This application is a national stage entry, filed under 35 U.S.C. § 371, of International Application No. PCT/GB2014/053845, filed on Dec. 24, 2014, which claims the benefit of and priority to Chinese Patent Application No. 201310724059.0, filed Dec. 24, 2013, the entire contents of each of which are incorporated herein by reference in their entireties and for all purposes.

TECHNICAL FIELD

The present invention relates to a method of positioning problem regions covered with an indoor wireless network, belonging to the field of maintenance of an indoor wireless network for mobile communication.

BACKGROUND OF THE INVENTION

In a voice-based communication 2G era, outdoor macro base stations will be able to realize indoor coverage. As wireless communication technologies develop and indoor data services increase, indoor wireless signals become increasingly important. An indoor distributed system becomes a main form to realize indoor wireless network coverage. Indoor wireless communication networks become more complex, 2G/3G/LTE/WiFi and other network standards coexist, so upgrading and maintenance of existing complex indoor wireless networks and quickly positioning indoor blind coverage areas and problem devices become increasingly difficult. Traditional indoor wireless network maintenance and upgrading methods, mainly based on customer complaints and field measurements by maintenance personnel to find blind coverage areas and problem devices, are not only time-consuming, but also incompetent to monitor the running states of indoor wireless networks in real time.

A wireless measurement report (MR, Measurement Report) reported by an ordinary user equipment (UE, User Equipment) to the network side can reflect the real-time operational status of an wireless network, because the wireless measurement report MR is not only a means by which the network understands the UE state in the communication process, but also the basis for network resource scheduling and management. When wireless access fails, enters a blind coverage area, or is switched to another cell, usually the UE will report the wireless measurement report MR to the network side using radio resource control (RRC, Radio Resource Control) signaling at the control side. The wireless measurement report MR includes various network parameters, including time information, the cell identification (Cell ID), the reference signal received power (RSRP, Reference Signal Received Power) and the reference signal received quality (RSRQ, Reference Signal Received Quality) of the serving cell, and the Cell IDs, RSRPs, RSRQs and other information of neighboring cells. Monitoring a wireless network operating status using a wireless measurement report MR has brought great convenience in maintaining wireless networks. In order to detect a wireless network running state more effectively, Long-Term Evolution (LTE, Long Term Evolution) proposes the use of a UE to automatically report parameters required for network optimization, wherein when network problems occur, such as access failures and entry of blind coverage areas, etc., the UE can always automatically record related network parameters and report the same to the network side through the wireless measurement report MR, no matter the UE is online or offline.

The use of the measurement report of the UE instead of doing field measurements by personnel has brought great convenience in locating wireless network problems. However, the wireless measurement report MR only records the problem cell and does not record the specific location thereof. For a network having indoor subsystems, usually one indoor subsystem includes a plurality of passive devices and a plurality of transmitting antennas. When the UE receives wireless signals from different transmitting antennas of the same indoor subsystem, these signals are from the same cell if seen from the network side, which brings new problems for locating blind coverage areas and problem devices of an indoor subsystem using the wireless measurement report MR.

SUMMARY OF THE INVENTION

To solve the above problems, the present invention provides a method of positioning problem regions covered with an indoor wireless network. It has the advantage of fast locating blind coverage areas and problem devices of an indoor wireless network. The method disclosed by the invention can precisely position the indoor network coverage problem regions and network devices with faults by means of the measurement report of a UE and an indoor signal fingerprint database of the building without on-site measuring by network maintenance personnel.

In order to achieve the above object, aspects of the present invention adopts the following technical solution:

According to a first aspect of the present invention there is provided a method of positioning problem regions covered with an indoor wireless network, the method comprising the following steps:

Step (1): constructing an indoor and outdoor combined three-dimensional spatial structural model of a target scene, wherein the scene comprises an indoor three-dimensional scene of a target building and an outdoor three-dimensional scene around the target building;

Step (2): recording and storing information of wireless access equipment which can be received by the target scene;

Step (3): establishing a wireless fingerprint database of the target building;

Step (4): collecting a wireless measurement report MR reported by a common user equipment UE on the network side of the wireless access equipment, analyzing the MR, and initially judging the position of the common UE with problems;

Step (5): preprocessing fingerprint identification data: preprocessing said wireless fingerprint database in Step (3) and information of said wireless measurement report MR collected in Step (4); and Step (6): judging specific position information of the common UE through fingerprint identification: calculating the mean square error between data records of said wireless measurement report MR pre-processed in Step (5) and data records of said wireless fingerprint database pre-processed in Step (5), and comparing and analyzing all the calculated mean square errors with a preset threshold respectively to further obtain the position information of the common UE, thereby determining if the common UE is in a normal handover state or in a faulty state.

According to a second aspect of the present invention there is provided a method for rapidly establishing an indoor wireless signal fingerprint database, comprising the following steps: constructing an indoor and outdoor combined three-dimensional (3D) scene model of a target building, predicting wireless signal field intensity information of 3D space, selecting a small quantity of testing points, within the target building, to perform manual field measurements and recording the wireless signal intensity information, correcting propagation model parameters depending on the difference between the actually measured wireless signal intensity information and the wireless signal intensity information calculated through the principle of the propagation model, predicting and establishing a wireless signal fingerprint database of the indoor and outdoor combined 3D scene model through the corrected propagation model parameters.

Said Step (1) may comprise the following steps: converting the building drawings in a CAD format of the target building into a three-dimensional spatial structural model of the building, converting a GIS map around the target building into an outdoor three-dimensional spatial structural model, and combining the indoor three-dimensional spatial structural model of the target building and the an outdoor three-dimensional spatial structural model around the target building into a combined indoor and outdoor three-dimensional spatial structural model of the scene.

The wireless access equipment in said Step (2) may comprise a wireless communication base station (NodeB) or a Wireless Local Area Network access point (WALN AP).

The information of said wireless access equipment in said Step (2) may comprise transmitting antenna data corresponding to each wireless access equipment, the transmitting antenna data including a number of transmitting antennas, position information of the antenna, a signal frequency of the antenna, a transmission power of the antenna, a three-dimensional radiation parameters of the antenna and a tilt angle of the antenna.

Said Step (3) may comprise the following steps:

Step (3-1): selecting a number of test points inside the target building for field testing, and recording wireless signal fingerprint information of the tested test points, wherein the wireless signal fingerprint information of the tested test points refers to the wireless access equipment identification information transmitted by the wireless access equipment in said Step (2) and actual wireless signal strength information;

Step (3-2): acquiring theoretical wireless signal fingerprint information of the selected test points in said Step (3-1), the theoretical wireless signal fingerprint information including the wireless access equipment identification information and theoretical wireless signal strength information, the theoretical wireless signal strength information being obtained by a three-dimensional ray-tracing propagation model algorithm;

Step (3-3): correcting the three-dimensional ray-tracing propagation model parameters according to the difference between the wireless signal strength information tested in said Step (3-1) and the theoretical wireless signal strength information calculated in said Step (3-2);

Step (3-4): recalculating the wireless signal strength information of the combined indoor and outdoor three-dimensional spatial structural model of said Step (1) of the wireless access equipment of said Step (2), using the corrected three-dimensional ray-tracing propagation model parameters; and Step (3-5): determining a number and positions of sampling points in a set height plane with a set sampling density on each floor of the building based on an area of each floor of the building; combining position information of one sampling point, the wireless access equipment identification information of the position, and the wireless signal strength information of the sampling point calculated in Step (3-4) into a data record, and storing the data record in the wireless signal fingerprint database; obtaining wireless signal fingerprint data records of the remaining sampling points using the same method to form a new wireless signal fingerprint database.

The test points in Step (3-1) may be selected based on a complexity degree of the building model, a building size, and a difficulty degree of on-site measuring, and wherein the test points have distance intervals between each other to distinguish different wireless signal fingerprint information.

The wireless access equipment identification information in Step (3-2) may be read from the parameters of the wireless access equipment, and the theoretical wireless signal strength information in Step (3-2) is obtained by a three-dimensional ray-tracing propagation model algorithm.

Said Step (3-2) may comprise the following steps:

Step (3-2-1): determining all the propagation paths reaching the reception point i by a ray transmitted by a transmitting antenna depending on the location of the transmitting antenna and the reception point, wherein N is the total number of the propagation paths reaching the reception point i by the ray transmitted by the transmitting antenna;

Step (3-2-2): calculating a propagation loss of each propagation path in a free space, wherein a propagation loss of the k-th path in the free space is $L_P(f, d_k)$ ($1 \leq k \leq N$), f is a signal frequency (MHz), and $d_k$ is a transmission distance (km) of the k-th path in the free space, and wherein, a propagation loss of the k-th path in the free space (dB) is calculated using the following equation if transmission, reflection and diffraction phenomena are not considered:

$$L_P(f, d_k) = 20 \log 10(f) + 20 \log 10(d_k) + 32.45$$

Step (3-2-3): calculating a propagation loss of each propagation path caused by building materials, wherein: LMAT (f) is the fading sum of transmission, reflection and diffraction of the k-th path caused by the building materials, T is a total number of the kinds of all building materials of the target building, a j-kind material is expressed as Mj ($1 \leq j \leq T$), δt, δd, δr are respectively the relationship coefficients indicating whether there is transmission, reflection and diffraction of the wireless signal on the k-th path, $$\delta_t = \begin{cases} 0, & \text{transmission of material } M_j \text{ does not exist} \\ 1, & \text{transmission of material } M_j \text{ exists} \end{cases},$$

$$\delta_d = \begin{cases} 0, & \text{diffraction of material } M_j \text{ does not exist} \\ 1, & \text{diffraction of material } M_j \text{ exists} \end{cases},$$

$$\delta_r = \begin{cases} 0, & \text{reflection of material } M_j \text{ does not exist} \\ 1, & \text{reflection of material } M_j \text{ exists} \end{cases},$$

$L_t(f, M_j)$, $L_d(f, M_j)$ and $L_r(f, M_j)$ are respectively the transmission, diffraction and reflection loss parameters of the material $M_j$ corresponding to the wireless signal frequency f and found in a wireless propagation loss parameter database for building materials, and the fading sum $L_{MAT}(f)$ of transmission, reflection and diffraction of the k-th path caused by the building materials is calculated using the following equation:

$$L_{MAT}(f) = \sum_{j=1}^{T}(\delta t * L_t(f, M_j) + \delta d * L_d(f, M_j) + \delta r * L_r(f, M_j))$$

Step (3-2-4): calculating a propagation loss L (f, $d_k$) of each propagation path using the following equation:

$$L(f, d_k) = L_P(f, d_k) + L_{MAT}(f);$$

Step (3-2-5): calculating the sum PL (dB) of the loss of the propagation paths of N rays reaching the reception point i, wherein since the energy of each ray is linear, calculating the total loss of multiple propagation paths can be performed by summing energy of each ray (mW), obtaining an average, and converting the energy value into a path loss value, and wherein the PL is calculated using the following equation:

$$PL = 10lg\left(\frac{1}{N}\sum_{k=1}^{N}\left(10^{\frac{L(f, d_k)}{10}}\right)\right)*.$$

Step (3-2-6): calculating the wireless signal strength of the reception point i, wherein assuming that Pi is the signal strength (dBm) of the reception point i, Pt is the transmit power (dBm) of the wireless signal transmitting antenna, and Gt and Gr are respectively the antenna gains (dBi) of the wireless signal transmitting antenna and the reception point i, the signal strength Pi of the reception point i is calculated using the following equation:

$$P_i = P_t - PL + G_t + G_r;$$

Step (3-2-7): respectively selecting other transmitting antennas of the wireless access device, repeating Steps (3-2-1) to (3-2-6) to acquire the signal strength of all transmitting antennas of the wireless access device reaching the reception point i, and choosing the strongest signal strength as the signal strength of the wireless access device reaching the reception point i; and Step (3-2-8): selecting different testing, and repeating Steps (3-2-1) to (3-2-7) to respectively obtain the wireless signal strength of all transmitting antennas of the wireless access device at all the testing points.

Correcting the parameters of the three-dimensional ray tracing propagation model in Step (3-3) refers to adjusting the wireless propagation loss parameters of the building materials using a simulated annealing algorithm.

Prior to adjusting the wireless propagation loss parameters of the building materials using a simulated annealing algorithm, you may need to define the following parameters:

(i) The cost function. The cost function for the simulated annealing algorithm is defined as a mean square error W between a signal strength measured at the reception point i and a theoretical wireless signal strength Pi, wherein the mean square error W is calculated using the following equation:

$$W = \sqrt{\frac{1}{N_P}\sum_{i=1}^{N_P}(O_i - P_i)^2}.$$

Therefore, the above cost function W is related to Pi only which is related to the wireless propagation loss parameters of the building materials. Np is the number of test points in material calibration.

(ii) The initial temperature $t_0$ of the simulated annealing algorithm is defined as $t_0$=1000° C.

(iii) The temperature fading function g(α): it is used to control the cooling rate during the annealing process and $t_{n+1} = t_n * g(\alpha)$ is set. Typically, g(α) is in the range of 0.9 to 0.99; preferably, the g(α)=0.95. And $t_n$ is the temperature after n times of annealing.

(iv) The Markov chain length L: it is the maximum time for adjusting the wireless propagation loss parameters of the building materials within the temperature $t_n$. When it reaches the maximum, the loop within the temperature $t_n$ is skipped. And L=300 times is set.

(v) The transition probability function: When the annealing temperature reaches $t_n$, and when 1<m≤L, the wireless propagation loss parameters of the building materials are adjusted for the m-th time, and the iteratively calculated cost function W is denoted as W(n, m). When the iteratively calculated cost function W(n, m) is smaller than the cost function W(n, m−1) iteratively calculated for (m−1)th time, or ΔW=W(n, m)−W(n,m−1)<0, then unconditionally transit the adjusted wireless propagation loss parameters of the building materials as the current solution.

When ΔW=W(n, m)−W(n, m−1)≥0, the adjusted wireless propagation loss parameters of the building materials transmitted by the defined transition probability function may be used as the current solution.

The transition probability function may be defined as exp(−ΔW/$t_n$). Thus, the transition probability function is a decreasing function of ΔW. When ΔW is higher, the transition probability function is smaller, and the probability to receive a new solution as the current solution is less.

(vi) The minimum temperature $t_f$: When the annealing temperature reaches a minimum temperature, the annealing process is completed, and $t_f$=0.01° C. is set.

(vii) When the cost function is less than the minimum Wmin, it means that the adjusted wireless propagation loss parameters of the building materials are good enough. Then, the annealing process ends, and Wmin=5 is set.

Said Step (3-3) may comprise the following steps:

Step (3-3-1): Choosing a starting point and performing initialization, wherein the initial temperature is defined as t0, and the initial values of a group of wireless propagation loss parameters of the building materials are defaults in the database, including the transmission loss parameter, the diffraction loss parameter and the reflection loss parameter of the building materials corresponding to a fixed transmit frequency, and recorded as a material parameter matrix $M_{(0,0)}$;

Step (3-3-2): First of all, setting temperature $t_n = t_0$, and the material parameter matrix $M_{(n,m)} = M_{(0,0)}$; computing the cost function W, and recording W as W(0,0), which means that it is a cost function at a temperature of $t_0$ and with the material parameter matrix of M(0,0);

Step (3-3-3): Conducting random perturbation for one element of the material parameter matrix, namely, three kinds of loss parameters (including the transmission loss parameter, the diffraction loss parameter and the reflection loss parameter) of one material, to produce a new material parameter matrix $M_{(n,m)}$, where 1<m≤L; calculating the cost function W(n, m), and calculating ΔW=W(n, m)−W(n, m−1);

Step (3-3-4): If ΔW<0, then accepting the adjusted material parameter matrix $M_{(n,m)}$ as a new solution to the wireless propagation loss parameters of the building materials, and performing Step (3-3-6);

Step (3-3-5): If ΔW≥0, calculating the exp (−ΔW/$t_n$) value; if exp (−ΔW/$t_n$) is greater than a randomly generated number random (0,1] between 0 and 1, i.e., exp $(-\Delta W/tn)$>random (0,1], then accepting the adjusted material parameter matrix $M_{(n,m)}$ as a new solution to the wireless propagation loss parameters of the building materials; otherwise, refusing to accept the adjusted material parameter matrix $M_{(n,m)}$ as a new solution to the wireless propagation loss parameters of the building materials, and keeping the original material parameter matrix $M_{(n,m-1)}$;

Step (3-3-6): Determining if the inner cycle from Step (3-3-3) to Step (3-3-6) is finished; when the number of inner cycles is larger than L, skipping the inner cycle to perform Step (3-3-7); otherwise, switching to Step (3-3-3) for the next inner cycle from Step (3-3-3) to Step (3-3-6);

Step (3-3-7): Determining if the outer cycle from Step (3-3-3) to Step (3-3-8) is finished; when the temperature is lowered to less than $t_f$ or the value of the cost function is less than the minimum Wmin, ending the outer loop and the simulated annealing algorithm; otherwise, switching to Step (3-3-8);

Step (3-3-8): Reducing the annealing temperature according to the temperature fading function; jumping back to the Step (3-3-3) to start the next inner cycle from Step (3-3-3) to Step (3-3-6).

The process of correcting the three-dimensional ray-tracing propagation model parameters refers to respectively adjusting the wireless propagation loss parameters of the building materials under different frequencies according to different mobile communication network standards (which use different wireless signal frequencies) to form new wireless propagation model parameters.

Step (3-5) may comprise: determining a number and positions of sampling points in a set height plane (e.g., 1 meter in height) with a set sampling density (e.g. 1 sampling point per m$^2$) on each floor of the building based on an area of each floor of the building; acquiring wireless signal strength information of one sampling point based on the theoretical wireless signal strength information of the wireless access equipment in a three-dimensional space calculated in Step (3-4); combining position information of one sampling point, the wireless access equipment identification information of the position, and the wireless signal strength information of the sampling point into a data record, and storing the data record in the wireless signal fingerprint database; obtaining wireless signal fingerprint data records of the remaining sampling points using the same method to form a new wireless signal fingerprint database.

Collecting a wireless measurement report MR reported by a common user equipment UE in Step (4) refer to collecting a wireless measurement report MR when the common user equipment UE is disconnected from the indoor wireless network and attempts to switch to a cell covered by another outdoor macro base station.

The wireless measurement report MR in Step (4) includes an identifier of a current serving cell (or an active cell), a reference signal power of the serving cell, a reference signal power of a neighboring serving cell, an identifier of a handover target cell and reference signal power information of the target cell.

Analyzing the wireless measurement report MR in Step (4) refers to initially judging the position of the common UE using the position information of an outdoor macro base station which is a handover target cell for the common user equipment UE.

The initial judgment is made based on the followings:

Assume: the outdoor macro base station of the handover target cell of the UE has a transmitting antenna with a serial number of Cdi and a position coordinate of NCdi($X_{Cdi}$, $Y_{Cdi}$, $Z_{Cdi}$), wherein $X_{Cdi}$, $Y_{Cdi}$, $Z_{Cdi}$ respectively represent the coordinates of the antenna Cdi in a three-dimensional space formed by axes x, y and z; the indoor wireless network is surrounded by outdoor base station transmitting antennas respectively numbered C1, C2, . . . , Cdm (di$\in$[1, . . . dm]); the outdoor base station transmitting antennas respectively have the position coordinates of NC1($X_{C1}$,$Y_{C1}$,$Z_{C1}$), NC2 ($X_{C2}$,$Y_{C2}$,$Z_{C2}$), and NCdm($X_{Cdm}$,$Y_{Cdm}$,$Z_{Cdm}$); the UE has a coordinate of UE (x, y, z)(0<x<X, 0<y<Y, 0<z<Z), and where X, Y, Z are the maximum positions on the coordinate axes of the target building three-dimensional space; the position of the UE in the building may be divided into the following three regions:

Region 1: the most possible region of the outdoor macro base station Cdi to which the UE will be handed over, wherein in the Region 1, any dp (dp≠di, 1≤dp≤dm) satisfies the following condition:

$$\sqrt{(x-X_{Cdi})^2+(y-Y_{Cdi})^2+(z-Z_{Cdi})^2} < \sqrt{(x-X_{Cdp})^2+(y-Y_{Cdp})^2+(z-Z_{Cdp})^2}$$

Region 3: the least possible region of the outdoor macro base station Cdi to which the UE will be handed over, wherein in the Region 3, any dp (dp≠di, 1≤dp≤dm) satisfies the following condition:

$$\sqrt{(x-X_{Cdi})^2+(y-Y_{Cdi})^2+(z-Z_{Cdi})^2} > \sqrt{(x-X_{Cdp})^2+(y-Y_{Cdp})^2+(z-Z_{Cdp})^2}.$$

Region 2: a general region of the outdoor macro base station Cdi to which the UE will be handed over, which does not belong to Regions 1 and 3.

For example, assume that the building has a cuboid shape including six sides A, B, C, D, E, and F (E, F respectively stand for the upper and lower sides). If the UE attempts to switch to the outdoor macro base station at the A side, and the outdoor macro base station is closest to the A side of the building and furthest to the C side of the building, it can be considered that the possibility that the UE is in the A side of the building is the highest, the UE may be located in a neighboring B or D side, and the possibility that the UE is in the C side of the building opposite the A side is the smallest.

The preprocessing step in said Step (5) comprises: forming a measurement report MR wireless signal fingerprint in accordance with the reference signal power of a neighboring cell received in the measurement report MR, the information of the measurement report MR wireless signal fingerprint not including indoor distributed system cells currently serving the UE; and deleting the cell information not included in the measurement report MR of the wireless signal fingerprint database of Step (3) based on the neighboring cell information included in the measurement report MR to form a new wireless signal fingerprint database.

Said Step (5) comprises the following steps:

Step (5-1): extracting reference signal powers of neighboring cells of the current serving cell from the measurement report MR of Step (4), wherein the neighboring cells of the current serving cell may include all or part of the outdoor cells numbered 1, 2, . . . , dm of Step (4); and assuming that the neighboring cell information of the measurement report MR includes information of dn (1≤dn≤dm) outdoor base station transmitting antennas, forming new wireless signal fingerprint information using the received signal strength information of the dn neighboring cells, wherein the new wireless signal fingerprint information may be expressed as E ($E_1$, $E_2$, . . . , $E_{dn}$); and Step (5-2): selecting cells having the same identifiers with the dn neighboring cells in Step (5-1) from the wireless signal fingerprint database established in the Step (3), and deleting the cell identification information and the cell wireless signal strength information that do not belong to the dn neighboring cells to form a new wireless signal fingerprint database, wherein each data record of the new database records the wireless signal strength information of the dn neighboring cells, and the wireless signal fingerprint record the UE can receive at the coordinate of (x, y, z) in theory is expressed as $E_{xyz}$ ($E_{xyz1}$, $E_{xyz2}$, ..., $E_{xyzdn}$).

Said comparing and analyzing step in said Step (6) comprises the following steps:

Step (6-1): comparing the wireless signal fingerprint information E ($E_1$, $E_2$, ..., $E_{dn}$) obtained by preprocessing the Measurement report MR in Step (5-1) and the wireless signal fingerprint information obtained by preprocessing the wireless signal fingerprint database in Step (5-2), and calculating the mean square error det (x, y, z) between the wireless signal fingerprint $E_{xyz}$ ($E_{xyz1}$, $E_{xyz2}$, ..., $E_{xyzdn}$) of each coordinate (x, y, z) in the wireless signal fingerprint database and the wireless signal fingerprint information E ($E_1$, $E_2$, ..., $E_{dn}$) according to the following equation:

$$\det(x, y, z) = \sqrt{(E_{xyz1} - E_1)^2 + (E_{xyz2} - E_2)^2 + \ldots + (E_{xyzdn} - E_{dn})^2};$$

and Step (6-2): comparing the det (x, y, z) value with a preset threshold value det to determine the position of the UE, including the following steps:

Step (6-2-1): when there is only one position having a mean square error less than det, determining that there is a fault in the indoor wireless network near the position having a mean square error less than det;

Step (6-2-2): when there is no position having a mean square error less than det, determining that the handover of the UE is normal, or there is no fault in the indoor wireless network after the UE is handed over from the indoor wireless network to an outdoor wireless network; and Step (6-2-3): when there is more than one position having a mean square error less than det, determining in combination with the position regions of the UE in Step (4), including the following steps: multiplying the det (x, y, z) values of the positions in the Regions 1, 2 and 3 with coefficients det1, det2 and det3 respectively to generate corrected Det (x, y, z) values; re-determining using the corrected Det (x, y, z) values, wherein det1<det2<det3, preferably (det1=1, det2=2, det3=3)

when the position falls in the Region 1: Det (x, y, z)=det (x, y, z)*det1, when the position falls in the Region 2: Det (x, y, z)=det (x, y, z)*det2, and when the position falls in the Region 3: Det (x, y, x)=det (x, y, z)*det3;

choosing a position having the minimum Det (x, y, z) value, and determining that there is a fault of the indoor wireless network at the position.

BENEFICIAL EFFECTS OF THE INVENTION

1. The process of establishing a wireless fingerprint database can be realized by using the following three methods: 1) A manual field measurement method involving a large amount of manual measurements. An advantage of this method is that the accuracy of establishing the fingerprint database is guaranteed, depending on the accuracy of the measuring equipment. The main drawback is that the establishing process is complex, especially for large scenes, and when the three-dimensional spatial environment changes, or the wireless access equipment changes, it needs to perform re-measurements. 2) A propagation model prediction method. This method has the advantages of easy establishment of the fingerprint database and easy maintenance. The disadvantage is that it is difficult to ensure the accuracy of the fingerprint database, depending on the matching degree between the propagation model and an actual scene. 3) A combined method of small amount measurements and a large amount of prediction. This method corrects the propagation model parameters by a small amount of testing points to ensure the matching degree between the propagation model and an actual scene. The corrected propagation model is used to predict the remaining points, which can quickly establish a reliable fingerprint database.

2. The case that the ordinary user equipment (UE) is disconnected from the indoor wireless network and attempts to switch to the outdoor macro base station cell may occur when the UE comes from indoors to outdoors, or when there is a fault in the indoor wireless network. By using the present invention, it can be determined if the UE comes from indoors to outdoors, or if there is a fault in the indoor wireless network.

3. By obtaining the signal strength information of adjacent cells based on the MR of the ordinary UE, the present invention is applicable to various mobile communication networks (i.e., Wireless Wide Area Networks) for handover of cells according to the MR, such as a Global System for Mobile Communications (GSM) network, a General Packet Radio Service (GPRS) network, a Code Division Multiple Access (CDMA) network, a CDMA2000 network, a Wideband Code Division Multiple Access (WCDMA) network, a Long Term Evolution (LTE) network or a World Interoperability for Microwave Access (WiMAX) network.

4. The present invention utilizes an MR sent by the ordinary UE, and MRs are collected from the network side, so no manual field measurements are needed. The time and frequency for collecting the MRs can be flexibly controlled according to the user's needs. In addition, the present invention does not require additional testing equipment, and therefore has cost advantages.

5. Through combined use of the location information of outdoor base station transmitting antennas and information of the MR from the UE, the present invention can determine the problem network area more accurately.

DETAILED DESCRIPTION OF PREFERRED EMBODIMENTS

Hereinafter the invention is further described with reference to accompanying figures and embodiments.

A method for method of positioning problem regions covered with an indoor wireless network according to the present invention is used for positioning blind coverage areas and problem devices of an indoor distributed system network within a target building. The five-floored target building has the same structure at each floor. A WCDMA network is established in the building. The WCDMA network covers the building through an indoor distributed system. The WCDMA network outside the target building is covered by outdoor macro base stations. The indoor distributed system and the outdoor macro base stations belong to different cells.

It needs to be noted that the present invention is not limited to WCDMA networks, and can also be applied to a combination of other wireless wide area networks.

Figure 1:
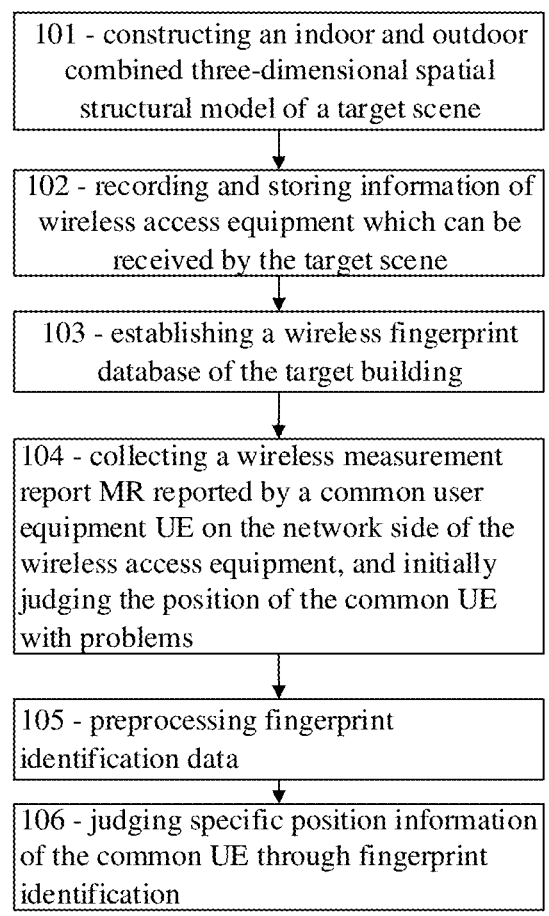
FIG. 1 shows a process of positioning a coverage problem area of an indoor wireless network.
Figure 2:
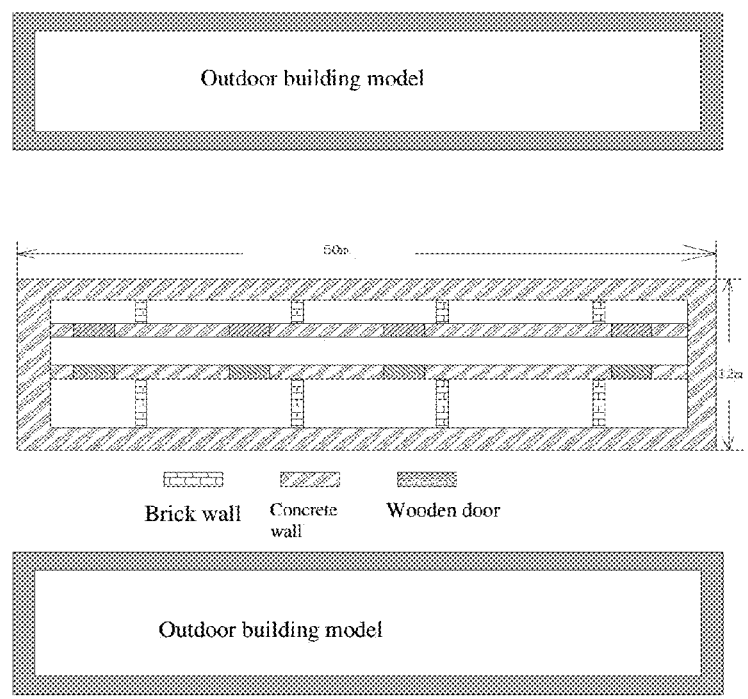
FIG. 2 is a plan view of the three-dimensional structure of the target building and a top view of its surrounding 3D buildings.

As shown in FIG. 1, a method of positioning problem regions covered with an indoor wireless network comprises the following steps:

Step (1): 101—constructing an indoor and outdoor combined three-dimensional spatial structural model of a target scene, wherein the scene comprises an indoor three-dimensional scene of a target building and an outdoor three-dimensional scene around the target building; converting the building drawings in a CAD format of the target building into a three-dimensional spatial structural model of the building using existing model establishing methods, converting a GIS map around the target building into an outdoor three-dimensional spatial structural model, and combining the indoor three-dimensional spatial structural model of the target building and the an outdoor three-dimensional spatial structural model round the target building into a combined indoor and outdoor three-dimensional spatial structural model of the scene. The indoor three-dimensional scene data illustrating the target building of the present embodiment comprises: a vertical storey height of the floor of 3 meters, a horizontal area of each floor of 600 square meters, building material (including brick walls, concrete walls and wooden doors) data of the floor, and the layout of each floor. The outdoor three-dimensional spatial structural model of the surrounding buildings includes: the location, the height and the exterior surface structure of the outdoor model, as shown in FIG. 2.

The present invention is applicable to various indoor 3D building scenes, indoor and outdoor combined 3D scenes, such as airports, stations, shopping malls, stadiums, tunnels, schools, residential areas and the like.

Figure 3:
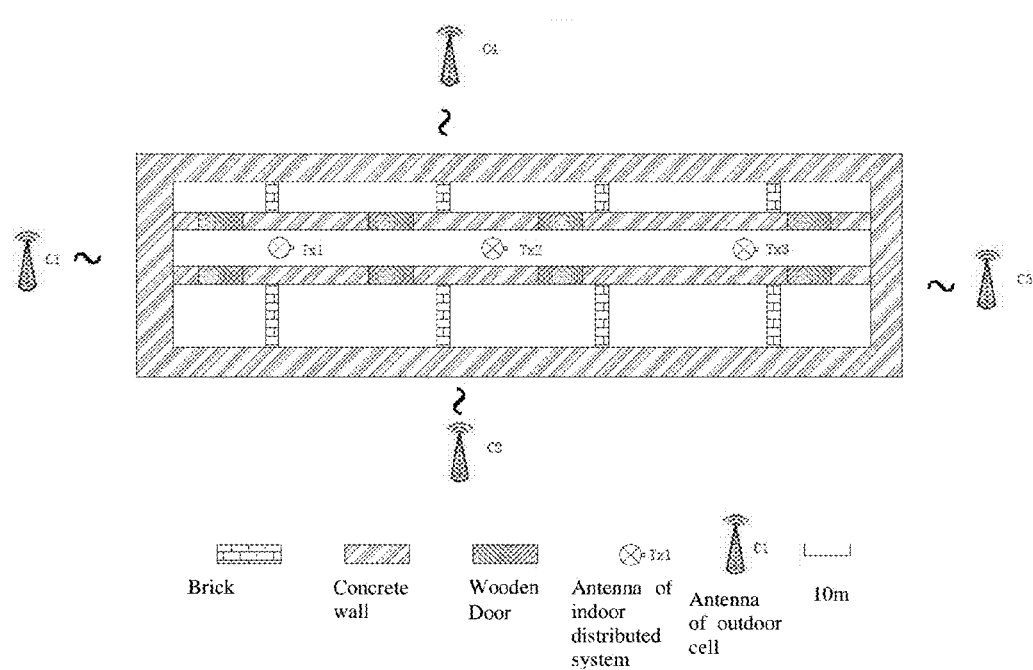
FIG. 3 is a schematic drawing showing the locations of indoor antennas of the three-dimensional target building and the locations of outdoor macro base stations.

Step (2): 102—recording and storing information of a wireless access equipment which can be received by the target building of Step (1). The building in the embodiment is provided with a WCDMA indoor distributed system whose transmitting antennas belong to the same cell. Each floor has three transmitting antennas, and there are totally 15 transmitting antennas. When the indoor distributed system has no fault, services are provided to the UE through the indoor distributed system in the building, while the UE can receive the signals transmitted by four macro base station cells outside the building. The indoor distributed system the home cell and outdoor cells are adjacent cells. The transmitting antenna data of the antennas of the indoor distributed system and outdoor base stations are recorded. The transmitting antenna data includes the specific location information of each indoor transmitting antenna, the specific location information of each outdoor transmitting antenna, the signal frequency of each transmitting antenna, the transmission power of each transmitting antenna, the 3D radiation parameters of each transmitting antenna, and an inclination angle of each transmitting antenna. The indoor transmitting antenna model of the present embodiment includes: a horizontal location of the transmitting antenna, a vertical height of the transmitting antenna of 2.4 m near the ceiling, an omnidirectional radiation antenna of 3 dBi as the transmitting antenna, a transmission power of 20 dBm of the transmitting antenna, a signal frequency of 2100 MHz of the transmitting antenna, and a lower inclination angle of 5 degrees of the transmitting antenna. The outdoor transmitting antenna model of the present embodiment includes: a horizontal location of the transmitting antenna, a vertical height of the transmitting antenna of 30 m, a directional plate antenna as the transmitting antenna, a transmission power of 46 dBm of the transmitting antenna, a signal frequency of 2100 MHz of the transmitting antenna, and a lower inclination angle of 10 degrees of the transmitting antenna. FIG. 3 is a schematic drawing showing the locations of indoor antennas (Tx1, Tx2, Tx3) on the first floor of the three-dimensional target building and the locations of outdoor macro base stations (C1, C2, C3, C4). It should be noted that the distance between the outdoor macro base stations and the target building is not an actual one, which is too far to be easily shown here.

Step (3): 103—establishing a wireless fingerprint database of the target building. The process of establishing a wireless fingerprint database can be realized by using the following three methods: 1) A manual field measurement method involving a large amount of manual measurements. An advantage of this method is that the accuracy of establishing the fingerprint database is guaranteed, depending on the accuracy of the measuring equipment. The main drawback is that the establishing process is complex, especially for large scenes, and when the three-dimensional spatial environment changes, or the wireless access equipment changes, it needs to perform re-measurements. 2) A propagation model prediction method. This method has the advantages of easy establishment of the fingerprint database and easy maintenance. The disadvantage is that it is difficult to ensure the accuracy of the fingerprint database, depending on the matching degree between the propagation model and an actual scene. 3) A combined method of small amount measurements and a large amount of prediction. This method corrects the propagation model parameters by a small amount of testing points to ensure the matching degree between the propagation model and an actual scene. The corrected propagation model is used to predict the remaining points, which can quickly establish a reliable fingerprint database. For details, please refer to the invention patent application titled "a method for rapidly establishing an indoor wireless signal fingerprint database".

Figure 4:
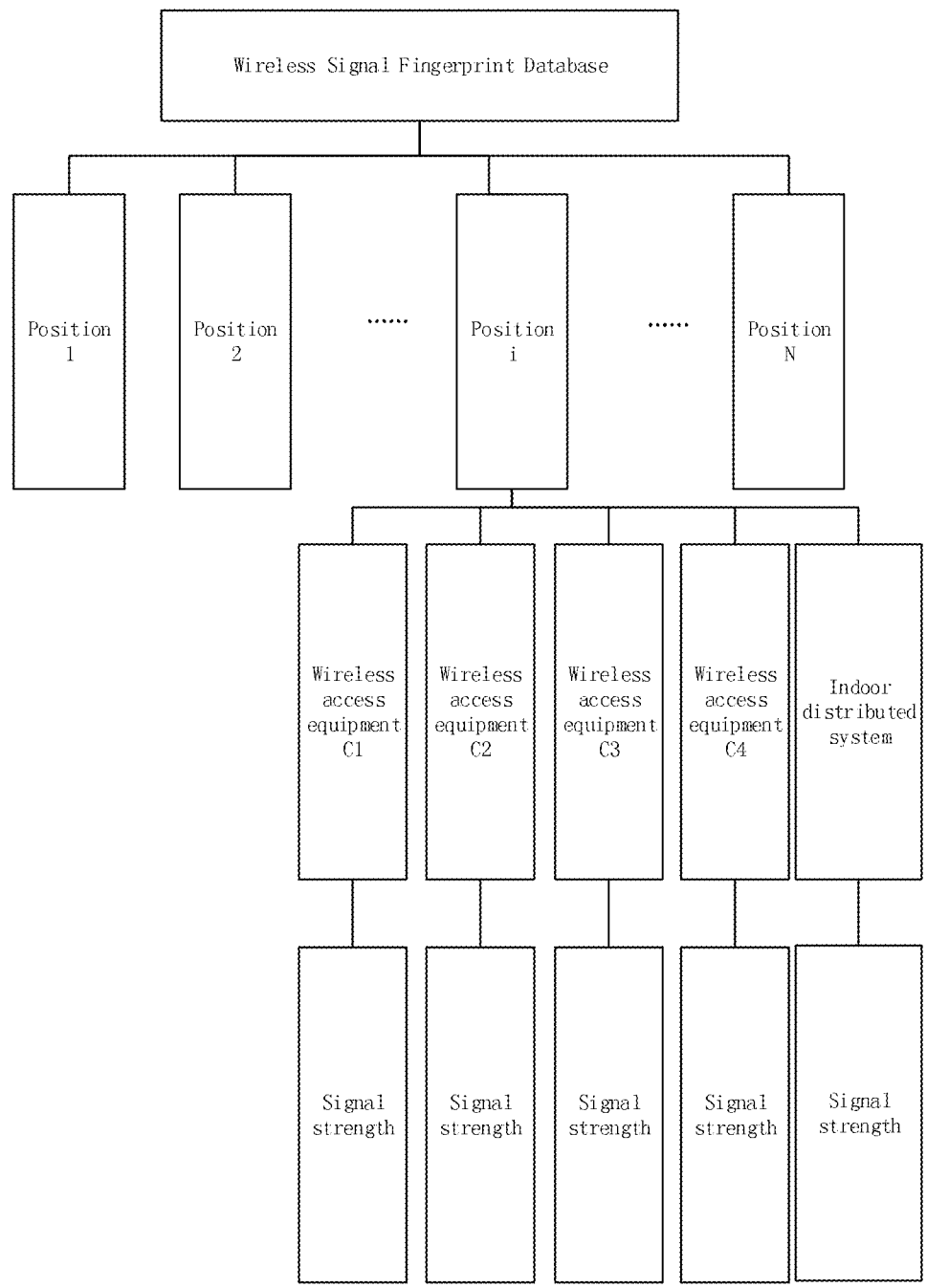
FIG. 4 shows a wireless signal fingerprint database established by using a combined method of small amount measurements and a large amount of prediction.

The present embodiment uses the third method, 3) a combined method of small amount measurements and a large amount of prediction, to establish a wireless signal fingerprint database for the target building. Wireless signals of four outdoor WCDMA cells and one indoor distributed system cell can be received in the target building in this embodiment. Each piece of wireless signal fingerprint data includes cell ID of the 5 cells and the reference signal strength received by the 5 cells. FIG. 4 is a diagram showing the structure of a wireless signal fingerprint database formed by the wireless signal fingerprints at N positions.

The method of establishing a wireless signal fingerprint database for the target building comprises the following Steps (3-1) to (3-5):

Step (3-1): selecting 30 test points inside the target building for field testing, and recording wireless signal fingerprint information of the tested test points, wherein the wireless signal fingerprint information of the tested test points refers to the wireless access equipment identification information transmitted by the wireless access equipment in said Step (2) and actual wireless signal strength information;

Step (3-2): acquiring theoretical wireless signal fingerprint information of the selected test points in said Step (3-1), the theoretical wireless signal fingerprint information including the wireless access equipment identification information and theoretical wireless signal strength information, the theoretical wireless signal strength information being obtained by a three-dimensional ray-tracing propagation model algorithm;

Step (3-3): correcting the three-dimensional ray-tracing propagation model parameters according to the difference between the wireless signal strength information tested in said Step (3-1) and the theoretical wireless signal strength information calculated in said Step (3-2);

Step (3-4): recalculating the wireless signal strength information of the combined indoor and outdoor three-dimensional spatial structural model of said Step (1) of the wireless access equipment of said Step (2), using the corrected three-dimensional ray-tracing propagation model parameters; and Step (3-5): determining a number and positions of sampling points in a set height plane with a set sampling density on each floor of the building based on an area of each floor of the building; combining position information of one sampling point, the wireless access equipment identification information of the position, and the wireless signal strength information of the sampling point calculated in Step (3-4) into a data record, and storing the data record in the wireless signal fingerprint database; obtaining wireless signal fingerprint data records of the remaining sampling points using the same method to form a new wireless signal fingerprint database.

The 30 test points in Step (3-1) are selected based on a complexity degree of the building model, a building size, and a difficulty degree of on-site measuring, and wherein the test points have distance intervals between each other to distinguish different wireless signal fingerprint information.

The wireless access equipment identification information in Step (3-2) is read from the parameters of the wireless access equipment, and the theoretical wireless signal strength information in Step (3-2) is obtained by a three-dimensional ray-tracing propagation model algorithm. This process is described in Steps (3-2-1) to (3-2-9).

Figure 5:
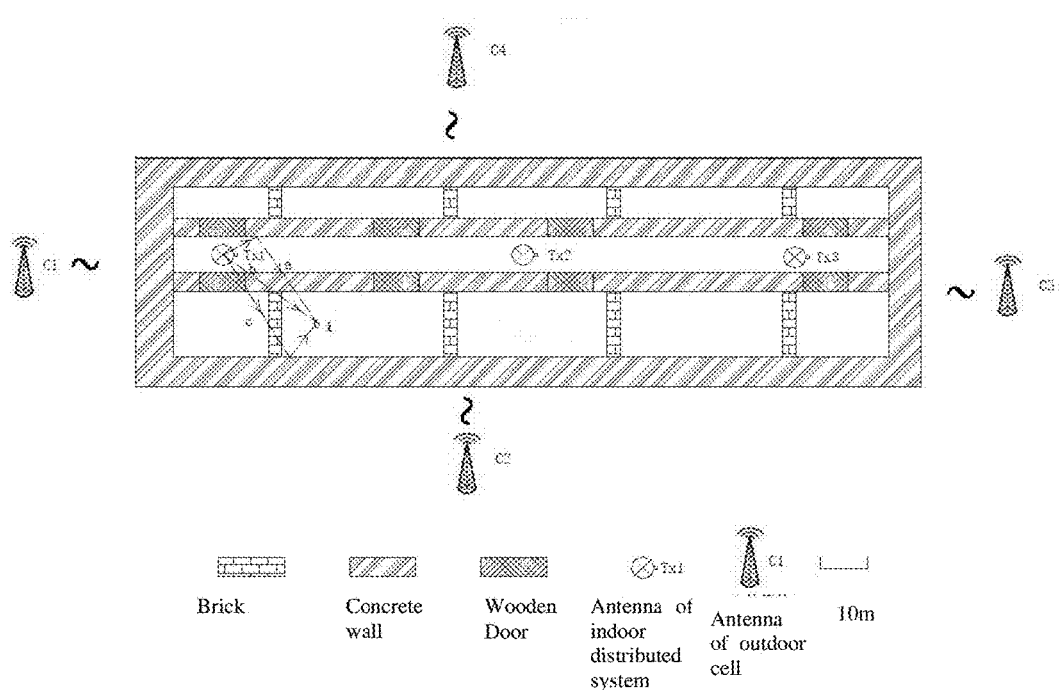
FIG. 5 is a schematic drawing showing the propagation paths of three rays transmitted by the WCDMA antenna at the left side and receivable by the testing point i.

Predicting the signal strength of a certain transmitting antenna received at a sampling point in the target building using a three-dimensional ray tracing propagation model algorithm comprises Steps (3-2-1) to (3-2-6) as below:

Step (3-2-1): determining all the propagation paths reaching the reception point i by a ray transmitted by the WCDMA wireless transmitting antenna (Tx1) at the left side of the indoor distributed system, depending on the location of the transmitting antenna of the WCDMA wireless transmitting antenna at the left side of the indoor distributed system and the location of the reception point i, wherein N equals to 3 and is the total number of the propagation paths, including the ray paths a-c, as shown in FIG. 5.

The ray path a is formed by being reflected by a concrete wall and passing through another concrete wall before reaching the reception point i. The ray path b is formed by passing through a concrete wall and a brick wall before reaching the reception point i. The ray path c is formed by passing through a wooden door and a brick wall and being reflected by a concrete wall before reaching the reception point i.

Step (3-2-2): calculating a propagation loss of each propagation path in a free space. The ray paths a-c have a length of 6.6 m, 5.2 m and 7.1 m respectively. The transmission frequency of the wireless signal is 2.1 GHz.

A propagation loss of the k-th path in the free space is $L_P(f, d_k)$ ($1 \leq k \leq N$), f is a signal frequency (MHz), and dk is a transmission distance (km) of the k-th path in the free space, and wherein, a propagation loss of the k-th path in the free space (dB) is calculated using the following equation if transmission, reflection and diffraction phenomena are not considered:

$$L_P(f, d_k) = 20 \log 10(f) + 20 \log 10(d_k) + 32.45$$

Based on the above equation, the propagation loss of the ray paths a-c in the free space is calculated as 55.29 dB, 53.21 dB and 55.92 dB respectively.

Step (3-2-3): calculating a propagation loss of each propagation path caused by building materials, wherein: $L_{MAT}(f)$ is the fading sum of transmission, reflection and diffraction of the k-th path caused by the building materials, T is a total number of the kinds of all building materials of the target building, a j-kind material is expressed as $M_j$ ($1 \leq j \leq T$), δt, δd, δr are respectively the relationship coefficients indicating whether there is transmission, reflection and diffraction of the wireless signal on the k-th path, $$\delta_t = \begin{cases} 0, & \text{transmission of material } M_j \text{ does not exist} \\ 1, & \text{transmission of material } M_j \text{ exists} \end{cases},$$

$$\delta_d = \begin{cases} 0, & \text{diffraction of material } M_j \text{ does not exist} \\ 1, & \text{diffraction of material } M_j \text{ exists} \end{cases},$$

$$\delta_r = \begin{cases} 0, & \text{reflection of material } M_j \text{ does not exist} \\ 1, & \text{reflection of material } M_j \text{ exists} \end{cases},$$

$L_t$ (f, $M_j$), $L_d$ (f, $M_j$) and $L_r$ (f, $M_j$) are respectively the transmission, diffraction and reflection loss parameters of the material $M_j$ corresponding to the wireless signal frequency f and found in a wireless propagation loss parameter database for building materials, and the fading sum $L_{MAT}$ (f) of transmission, reflection and diffraction of the k-th path caused by the building materials is calculated using the following equation:

$$L_{MAT}(f) = \sum_{j=1}^{T} (\delta t * L_t(f, M_j) + \delta d * L_d(f, M_j) + \delta r * L_r(f, M_j))$$

According to the building material wireless propagation loss parameter database, when the wireless signal frequency is 2.1 GHz, the transmission loss of a brick wall, a concrete wall, and a wooden door are 6.77 dB, 20.25 dB, 4.44 dB, respectively. According to the equation of $$L_{MAT}(f) = \sum_{j=1}^{T}(\delta t * L_t(f, M_j) + \delta d * L_d(f, M_j) + \delta r * L_r(f, M_j))$$

the loss of path a is the reflection loss of a concrete wall and the transmission loss of a concrete wall, the loss of path b is the transmission loss of a concrete wall and the transmission loss of a brick wall, the loss of path c is the transmission loss of a wooden door, the transmission loss of a brick wall, and the reflection loss of a concrete wall. The wireless propagation loss for the ray paths a-c caused by building materials are calculated as 26.25 dB, 27.02 dB, 17.21, respectively.

Step (3-2-4): calculating a propagation loss L (f, $d_k$) of each propagation path using the following equation:

$$L(f,d_k)=L_P(f,d_k)+L_{MAT}(f);$$

According to the above equation, the propagation loss L (f, $d_k$) of the ray paths a-c reaching the reception point i is calculated as 81.54 dB, 80.23 dB, 73.13 dB, respectively.

Step (3-2-5): calculating the sum PL (dB) of the loss of the propagation paths of N=3 rays reaching the reception point i, wherein since the energy of each ray is linear, calculating the total loss of multiple propagation paths can be performed by summing energy of each ray (mW), obtaining an average, and converting the energy value into a path loss value, and wherein the PL is calculated using the following equation:

$$PL = 10lg\left(\frac{1}{N}\sum_{k=1}^{N}\left(10^{\frac{L(f,d_k)}{10}}\right)\right)*.$$

The total loss of the ray paths a-c is calculated as PL=79.52 dB.

Step (3-2-6): calculating the wireless signal strength of the reception point i, wherein assuming that Pi is the signal strength (dBm) of the reception point i, Pt is the transmit power (dBm) of the wireless signal transmitting antenna, and Gt and Gr are respectively the antenna gains (dBi) of the wireless signal transmitting antenna and the reception point i, the signal strength Pi of the reception point i is calculated using the following equation:

$$P_i=P_t-PL+G_t+G_r.$$

Since Step (2) describes that both the wireless transmitting antenna and the receiving point i have an antenna gain of 3 dBi, Pt is the transmit power (dBm) of the wireless signal transmitting antenna, and Gt and Gr are respectively the antenna gains (dBi) of the wireless signal transmitting antenna and the reception point i, the signal strength Pi of the reception point i is calculated as P i=−53.52 dBm according to the formula $$P_i=P_t-PL+G_t+G_r.$$

Step (3-2-7): by repeating Steps (3-2-1) to (3-2-6), the field strength at the reception point i generated by other transmitting antennas of the WCDMA indoor distributed system can be calculated to be less than −53.52 dBm. Since 15 transmitting antennas of the WCDMA indoor distributed system belong to the same wireless access equipment, the wireless signal strength of the WCDMA indoor distributed system the point i can receive is −53.52 dBm.

Step (3-2-8): by repeating Steps (3-2-1) to (3-2-7), the signal strength at the reception point i generated by the transmitting antennas of other four WCDMA outdoor macro base stations can be calculated.

Step (3-2-9): selecting different testing, and repeating Steps (3-2-1) to (3-2-8) to respectively obtain the wireless signal strength of all transmitting antennas of the wireless access device at all the testing points.

Correcting the parameters of the three-dimensional ray tracing propagation model in Step (3-3) refers to adjusting the wireless propagation loss parameters of the building materials using a simulated annealing algorithm.

Prior to adjusting the wireless propagation loss parameters of the building materials using a simulated annealing algorithm, you need to define the following parameters:

(i) The cost function. The cost function for the simulated annealing algorithm is defined as a mean square error W between a signal strength measured at the reception point i and a theoretical wireless signal strength Pi, wherein the mean square error W is calculated using the following equation:

$$W = \sqrt{\frac{1}{N_P}\sum_{i=1}^{N_P}(O_i - P_i)^2}.$$

Therefore, the above cost function W is related to $P_i$ only which is related to the wireless propagation loss parameters of the building materials. $N_p$ is the number of test points in material calibration and equals to 30.

(ii) The initial temperature t0 of the simulated annealing algorithm is defined as t 0=1000° C.

(iii) The temperature fading function g(α): it is used to control the cooling rate during the annealing process and $t_{n+1}=t_n*g(α)$ is set. Typically, g(α) is in the range of 0.9 to 0.99; preferably, the g(α)=0.95. And tn is the temperature after n times of annealing.

(iv) The Markov chain length L: it is the maximum time for adjusting the wireless propagation loss parameters of the building materials within the temperature $t_n$. When it reaches the maximum, the loop within the temperature $t_n$ is skipped. And L=300 times is set.

(v) The transition probability function: When the annealing temperature reaches $t_n$, and when a<m≤L, the wireless propagation loss parameters of the building materials are adjusted for the m-th time, and the iteratively calculated cost function W is denoted as W(n, m). When the iteratively calculated cost function W(n, m) is smaller than the cost function W(n, m−1) iteratively calculated for (m−1)th time, or ΔW=W(n, m)−W(n, m−1)<0, then unconditionally transit the adjusted wireless propagation loss parameters of the building materials as the current solution.

When ΔW=W(n, m)−W(n, m−1)≥0, the adjusted wireless propagation loss parameters of the building materials transmitted by the defined transition probability function is used as the current solution.

The transition probability function is defined as exp (−ΔW/$t_n$). Thus, the transition probability function is a decreasing function of ΔW. When ΔW is higher, the transition probability function is smaller, and the probability to receive a new solution as the current solution is less.

(vi) The minimum temperature $t_j$: When the annealing temperature reaches a minimum temperature, the annealing process is completed, and $t_j$=0.01° C. is set.

(vii) When the cost function is less than the minimum Wmin, it means that the adjusted wireless propagation loss parameters of the building materials are good enough. Then, the annealing process ends, and Wmin=5 is set.

Figure 6:
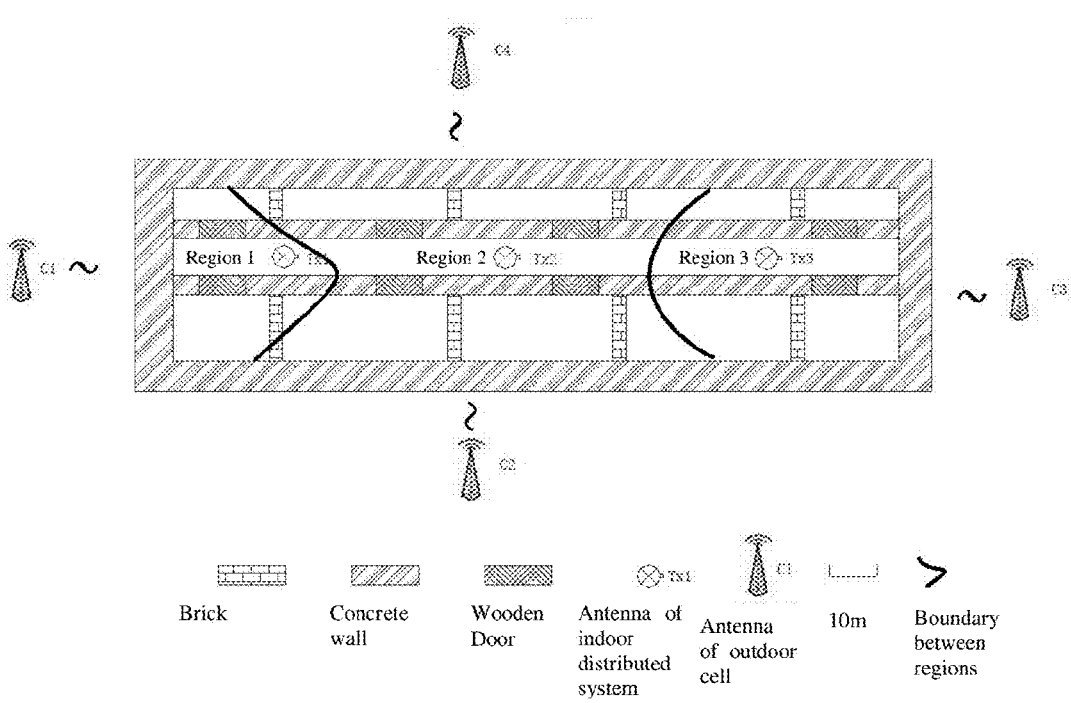
FIG. 6 is a flowchart of correcting the wireless propagation loss parameters of the building materials using a simulated annealing algorithm.

Adjusting the wireless propagation loss parameters of the building materials using a simulated annealing algorithm comprises Steps (3-3-1) to (3-3-8), as shown in FIG. 6.

Step (3-3-1): 701—Choosing a starting point and performing initialization, wherein the initial temperature is defined as t0, and the initial values of a group of wireless propagation loss parameters of the building materials are defaults in the database, including the transmission loss parameter, the diffraction loss parameter and the reflection loss parameter of the building materials corresponding to a fixed transmit frequency, and recorded as a material parameter matrix $M_{(0,0)}$;

Step (3-3-2): 702—First of all, setting temperature $t_n=t_0$, and the material parameter matrix $M_{(n,m)}=M_{(0,0)}$; computing the cost function W, and recording W as W(0,0), which means that it is a cost function at a temperature of $t_0$ and with the material parameter matrix of $M_{(0,0)}$;

Step (3-3-3): 703—Conducting random perturbation for one element of the material parameter matrix, namely, three kinds of loss parameters (including the transmission loss parameter, the diffraction loss parameter and the reflection loss parameter) of one material, to produce a new material parameter matrix $M_{(n,m)}$, where $1<m\leq L$; calculating the cost function W(n,m), and calculating $\Delta W=W(n, m)-W(n, m-1)$;

Step (3-3-4): 704—If $\Delta W<0$, then accepting the adjusted material parameter matrix $M_{(n,m)}$ as a new solution to the wireless propagation loss parameters of the building materials, and performing Step (3-3-6);

Step (3-3-5): If $\Delta M \geq 0$, calculating the exp $(-\Delta W/tn)$ value; if exp $(-\Delta W/tn)$ is greater than a randomly generated number random (0,1] between 0 and 1, i.e., exp $(-\Delta W/tn)$>random (0,1], then accepting the adjusted material parameter matrix $M_{(n,m)}$ as a new solution to the wireless propagation loss parameters of the building materials; otherwise, refusing to accept the adjusted material parameter matrix $M_{(n,m)}$ as a new solution to the wireless propagation loss parameters of the building materials, and keeping the original material parameter matrix $M_{(n,m-1)}$;

Step (3-3-6): 706—Determining if the inner cycle from Step (3-3-3) to Step (3-3-6) is finished; when the number of inner cycles is larger than L, skipping the inner cycle to perform Step (3-3-7); otherwise, switching to Step (3-3-3) for the next inner cycle from Step (3-3-3) to Step (3-3-6);

Step (3-3-7): 707—Determining if the outer cycle from Step (3-3-3) to Step (3-3-8) is finished: when the temperature is lowered to less than $t_f$ or the value of the cost function is less than the minimum Wmin, ending the outer loop and the simulated annealing algorithm; otherwise, switching to Step (3-3-8);

Step (3-3-8): 708—Reducing the annealing temperature according to the temperature fading function, jumping back to the Step (3-3-3) to start the next inner cycle from Step (3-3-3) to Step (3-3-6).

The process of correcting the three-dimensional ray-tracing propagation model parameters refers to respectively adjusting the wireless propagation loss parameters of the building materials under different frequencies according to different mobile communication network standards (which use different wireless signal frequencies) to form new wireless propagation model parameters.

Step (3-5) comprises: determining a number and positions of sampling points in a set height plane (e.g., 1 meter in height) with a set sampling density (e.g. 1 sampling point per $m^2$) on each floor of the building based on an area of each floor of the building; acquiring wireless signal strength information of one sampling point based on the theoretical wireless signal strength information of the wireless access equipment in a three-dimensional space calculated in Step (3-4); combining position information of one sampling point, the wireless access equipment identification information of the position, and the wireless signal strength information of the sampling point into a data record, and storing the data record in the wireless signal fingerprint database; obtaining wireless signal fingerprint data records of the remaining sampling points using the same method to form a new wireless signal fingerprint database.

Step (4): 104—collecting a wireless measurement report MR reported by the common user equipment UE on the network side of the wireless access equipment, analyzing the MR, and initially judging the position of the common UE with problems. Collecting a wireless measurement report MR reported by a common user equipment UE refers to collecting a wireless measurement report MR when the common user equipment UE is disconnected from the indoor wireless network and attempts to switch to a cell covered by another outdoor macro base station. The wireless measurement report MR includes an identifier of a current serving cell (or an active cell), a reference signal power of the serving cell, a reference signal power of a neighboring serving cell, an identifier of a handover target cell and reference signal power information of the target cell. Analyzing the wireless measurement report MR refers to initially judging the position of the common UE using the position information of an outdoor macro base station which is a handover target cell for the common user equipment UE. The target building of this embodiment has 4 surrounding outdoor macro base stations C1, C2, C3, C4. Assume the measurement report MR reported by a common user equipment UE shows that the UE attempts to be switched to the transmission cell of the base station C1, and the transmitting antennas of the 4 surrounding outdoor macro base stations C1, C2, C3, C4 respectively have the following coordinates: NC1 $(X_{C1}, Y_{C1}, Z_{C1})$, NC2 $(X_{C2}, Y_{C2}, Z_{C2})$, NC3 $(X_{C3}, Y_{C3}, Z_{C3})$, and NC4 $(X_{C4}, Y_{C4}, Z_{C4})$.

Region 1: the most possible region in which the UE will be handed over to the outdoor macro base station C1, wherein in the Region 1, any dp (dp≠d1, 2≤dp≤4) satisfies the following condition:

$$\frac{\sqrt{(x-X_{C1})^2+(y-Y_{C1})^2+(z-Z_{C1})^2}}{\sqrt{(x-X_{Cdp})^2+(y-Y_{Cdp})^2+(z-Z_{Cdp})^2}} <$$

Region 3: the least possible region in which the UE will be handed over to the outdoor macro base station C1, wherein in the Region 3, any dp (dp≠d1, 2≤dp≤4) satisfies the following condition:

$$\frac{\sqrt{(x-X_{C1})^2+(y-Y_{C1})^2+(z-Z_{C1})^2}}{\sqrt{(x-X_{Cdp})^2+(y-Y_{Cdp})^2+(z-Z_{Cdp})^2}} >$$

Region 2: a general region in which the UE will be handed over to the outdoor macro base station C1, which does not belong to Regions 1 and 3.

Figure 7:
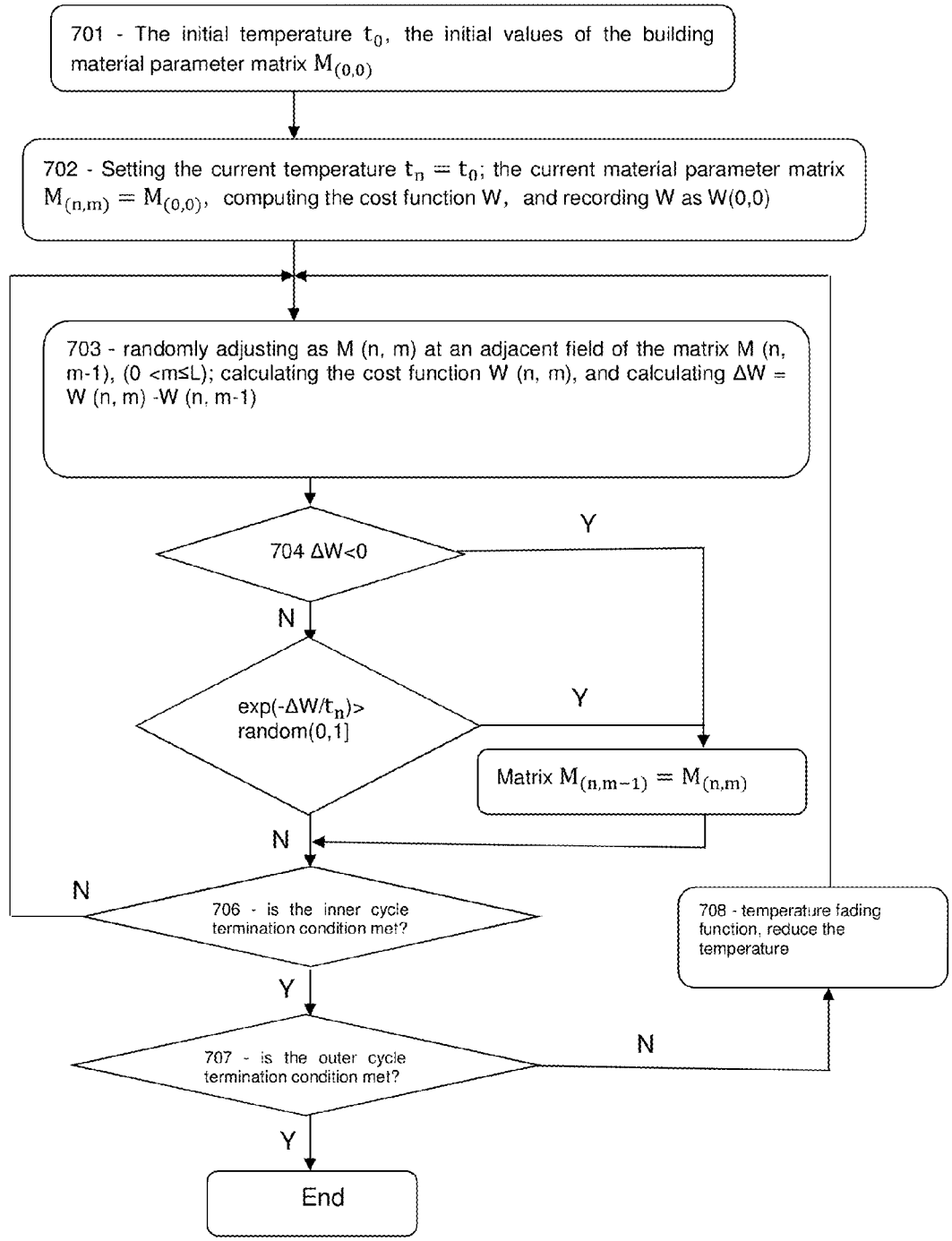
FIG. 7 shows the regions into which the outdoor base station C1 may be switched.

FIG. 7 shows the regions into which the outdoor base station C1 may be switched.

Step (5): 105—preprocessing fingerprint identification data.

The preprocessing step in said Step (5) comprises: forming a measurement report MR wireless signal fingerprint in accordance with the reference signal power of a neighboring cell received in the measurement report MR, the information of the measurement report MR wireless signal fingerprint not including indoor distributed system cells currently serving the UE; and deleting the cell information not included in the measurement report MR of the wireless signal fingerprint database of Step (3) based on the neighboring cell information included in the measurement report MR to form a new wireless signal fingerprint database.

Figure 8:
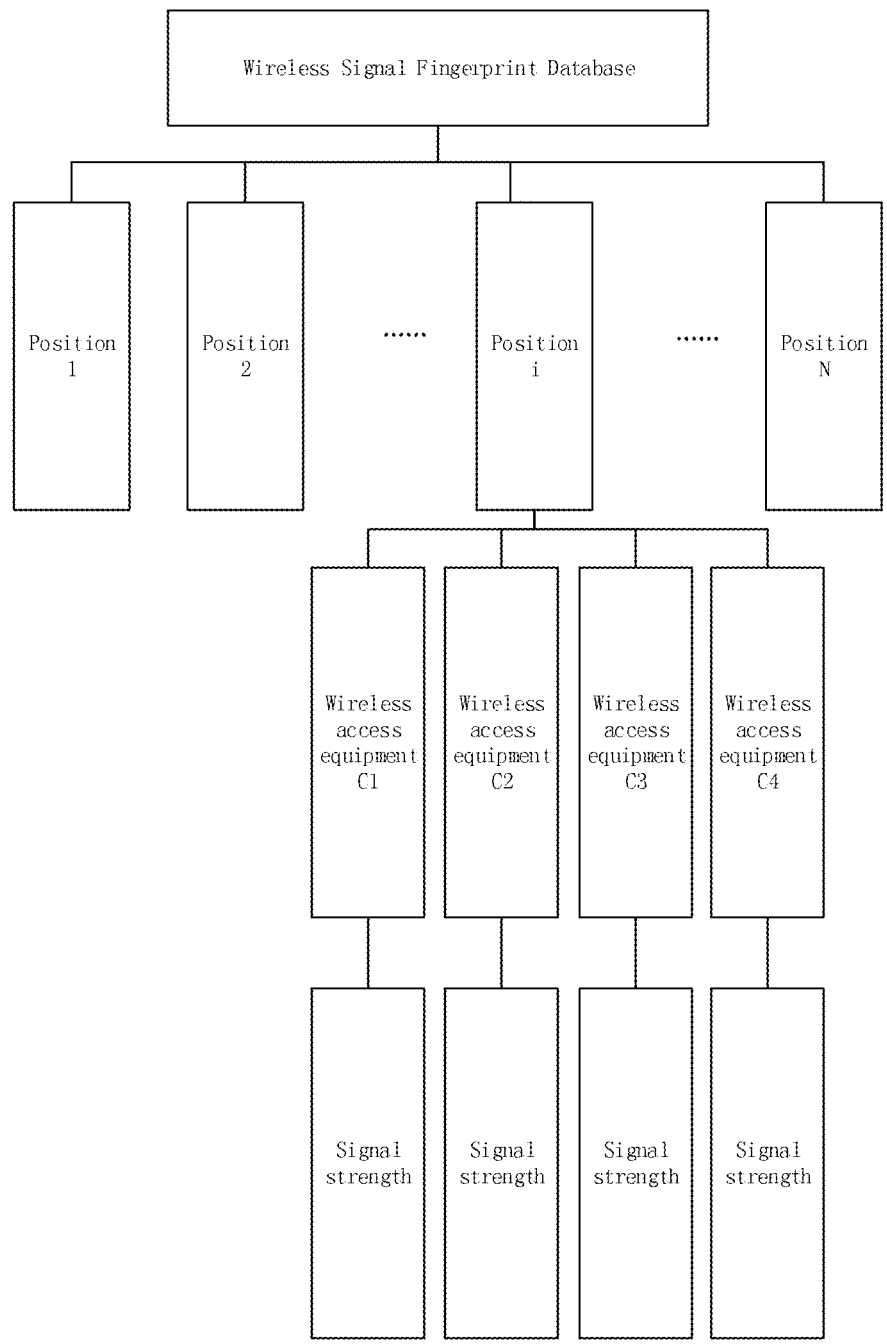
FIG. 8 shows the structure of a preprocessed wireless signal fingerprint database.

Said Step (5) comprises the following steps:

Step (5-1): extracting reference signal powers of neighboring cells of the current serving cell from the measurement report MR of Step (4), wherein the neighboring cells of the current serving cell may include all or part of the 4 outdoor cells of Step (4); and assuming that the neighboring cell information of the measurement report MR includes information of 4 outdoor base station transmitting antennas C1, C2, C3, C4, forming new wireless signal fingerprint information using the received signal strength information of the 4 neighboring cells, wherein the new wireless signal fingerprint information may be expressed as E ($E_1$, $E_2$, $E_3$, $E_4$); and Step (5-2): selecting cells having the same identifiers with the 4 neighboring cells in Step (5-1) from the wireless signal fingerprint database established in the Step (3), and deleting the cell identification information and the cell wireless signal strength information that do not belong to the 4 neighboring cells to form a new wireless signal fingerprint database, wherein each data record of the new database records the wireless signal strength information of the 4 neighboring cells, and the wireless signal fingerprint record at the coordinate of (x, y, z) is expressed as $E_{xyz}$ ($E_{xyz1}$, $E_{xyz2}$) . . . , $E_{xyz4}$), as shown in FIG. 8. In this embodiment, since information of the 4 neighboring outdoor cells can be received, it is not necessary to delete the information of neighboring outdoor cells, and only the cell ID and the cell signal strength of the current indoor distributed system need to be deleted.

Step (6): 106—judging specific position information of the common UE through fingerprint identification: calculating the mean square error between data records of said wireless measurement report MR pre-processed in Step (5) and data records of said wireless fingerprint database pre-processed in Step (5). When there is more than one mean square errors less than a preset threshold (6 dB), the position information of the UE is initially judged in association with Step (4) to determine the position information of the UE again. The position information of the UE includes the information of the floor on which the UE is located and the position information of the UE on that floor. The possible problem passive device is determined based on the position information of the UE.

Step (6-1): comparing the wireless signal fingerprint information E ($E_1$, $E_2$, . . . , $E_4$) obtained by preprocessing the Measurement report MR in Step (5-1) and the wireless signal fingerprint information obtained by preprocessing the wireless signal fingerprint database in Step (5-2), and calculating the mean square error det (x, y, z) between the wireless signal fingerprint $E_{xyz}$ ($E_{xyz1}$, $E_{xyz2}$) . . . , $E_{xyz4}$) of each coordinate (x, y, z) in the wireless signal fingerprint database and the wireless signal fingerprint information E ($E_1$, $E_2$, . . . , $E_4$) according to the following equation:

$$det(x, y, z) = \sqrt{((E_{xyz1} - E_1)^2 + (E_{xyz2} - E_2)^2 + \ldots + (E_{xyz4} - E_4)^2)}$$

Step (6-2): comparing the det (x, y, z) value with a preset threshold value det to determine the position of the UE, wherein the threshold value det is preferably set as det=6 dB.

As described in Step (4) in the above, it is assumed that the UE attempts to switch to a cell of an outdoor macro base station C1, and, in accordance with Step (6-1), the det (x, y, z) of two positions is calculated to be less than or equal to the preset threshold value det, wherein one data record appears in the Region 1 of C1, and another data record appears in the Region 2 of C1, it can be determined that the location of the data record in the Region 1 of C1 is the switch position of the UE; if the position is near the antenna TX1 on the first floor, it can be determined that the antenna TX1 of the indoor distributed system has failed.

The mean square error threshold value det, which is selected to be 6 dB, between the data record in the MR and the data record in the wireless fingerprint database in this embodiment is not fixed, but it may be selected according to the actual conditions such as different scenes. A relatively larger threshold value will mistakingly report a normal switch from an indoor cell to an outdoor cell as an indoor wireless network equipment failure, while a relatively smaller one may omit to report an indoor wireless network equipment failure.

While certain exemplary embodiments of this invention have been described with reference to the accompanying drawings, it is to be understood that such embodiments are merely illustrative of and not restrictive on the broad invention, and that this invention is not limited to the specific constructions and arrangements shown and described, since various other modifications may occur to those of ordinary skill in the art without any inventive work.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method of positioning problem regions covered with an indoor wireless network, the method comprising the following steps:

constructing an indoor and outdoor combined three-dimensional spatial structural model of a target scene, wherein the scene comprises an indoor three-dimensional scene of a target building and an outdoor three-dimensional scene around the target building;

recording and storing information of wireless access equipment whose transmissions can be received in the target scene;

establishing a wireless fingerprint database of the target building;

collecting a wireless measurement report (MR) reported by a common user equipment (UE) on a network side of the wireless access equipment, analyzing the MR, and initially judging the position of a common UE within the positioning problem regions;

preprocessing fingerprint identification data of the wireless fingerprint database and information of the wireless measurement report MR;

judging specific position information of the common UE through the fingerprint identification data: calculating an error between data records of the preprocessed information of the wireless measurement report (MR)

and data records of the preprocessed wireless fingerprint database, and comparing and analyzing all calculated errors with a preset threshold respectively to further obtain the specific position information of the common UE.

2. The method of positioning problem regions covered with an indoor wireless network according to claim 1, wherein calculating the error between the data records of the preprocessed information of the wireless measurement report (MR) and the data records of the preprocessed wireless fingerprint database is calculating the mean square error between data records of the wireless measurement report (MR) and data records of the wireless fingerprint database.

3. The method of positioning problem regions covered with an indoor wireless network according to claim 1, further comprising: converting building drawings in a CAD format of the target building into a three-dimensional spatial structural model of the building, converting a GIS map around the target building into an outdoor three-dimensional spatial structural model, and combining the indoor three-dimensional spatial structural model of the target building and the outdoor three-dimensional spatial structural model around the target building into a combined indoor and outdoor three-dimensional spatial structural model.

4. The method of positioning problem regions covered with an indoor wireless network according to claim 1, wherein the information of said wireless access equipment comprises transmitting antenna data corresponding to each wireless access equipment, the transmitting antenna data including a number of transmitting antennas, position information of the antenna, signal frequency of the antenna, transmission power of the antenna, a three-dimensional radiation parameters of the antenna and a tilt angle of the antenna.

5. The method of positioning problem regions covered with an indoor wireless network according to claim 1, further comprising:
   selecting a number of test points inside the target building for field testing, and recording wireless signal fingerprint information of a tested test points, wherein the wireless signal fingerprint information of the tested test points refers to the wireless access equipment identification information transmitted by the wireless access equipment and wireless signal strength information;
   acquiring theoretical wireless signal fingerprint information of the selected test points, the theoretical wireless signal fingerprint information including the wireless access equipment identification information and theoretical wireless signal strength information, the theoretical wireless signal strength information being obtained by a three-dimensional ray-tracing propagation model algorithm;
   calibrating a three-dimensional ray-tracing propagation model parameters according to a difference between the wireless signal strength information and the theoretical wireless signal strength information;
   recalculating the wireless signal strength information of the combined indoor and outdoor three-dimensional spatial structural model, using the calibrated three-dimensional ray-tracing propagation model parameters; and
   determining a number and positions of sampling points in a set height plane with a set sampling density on each floor of the building based on an area of each floor of the building; combining position information of one sampling point, the wireless access equipment identification information of the position, and the wireless signal strength information of the sampling point into a data record, and storing the data record in the wireless signal fingerprint database; obtaining wireless signal fingerprint data records of remaining sampling points to form a wireless signal fingerprint database.

6. The method of positioning problem regions covered with an indoor wireless network according to claim 5, wherein the test points are selected based on a complexity degree of a building model, a building size, and a difficulty degree of on-site measuring, and wherein the test points should have distance intervals between each other to distinguish different wireless signal fingerprint information.

7. The method of positioning problem regions covered with an indoor wireless network according to claim 5, wherein the preprocessing step further comprises: forming a wireless signal fingerprint information in accordance with the reference signal power of neighboring cells received in the measurement report MR, the information of the wireless signal fingerprint not including indoor distributed system cells currently serving the UE; and deleting the cell information not included in the measurement report (MR) in the wireless signal fingerprint database of Step (3) based on a neighboring cell information included in the measurement report MR to form a new wireless signal fingerprint database.

8. The method of positioning problem regions covered with an indoor wireless network according to claim 1, wherein collecting a wireless measurement report (MR) reported by a common user equipment (UE) includes collecting a wireless measurement report (MR) when the common user equipment (UE) is disconnected from the indoor wireless network and attempts to switch to a cell covered by another outdoor macro base station; and
   wherein the wireless measurement report (MR) in Step (4) includes an identifier of a current serving cell, a reference signal power of the serving cell, reference signal power of a neighboring cells, an identifier of a handover target cell and reference signal power information of the target cell.

9. The method of positioning problem regions covered with an indoor wireless network according to claim 1, wherein analyzing the wireless measurement report (MR) to initially judging the position of the common UE using a position information of an outdoor macro base station which is a handover target cell for the common user equipment UE.

10. The method of positioning problem regions covered with an indoor wireless network according to claim 1 preceding, wherein said Step (5) comprises the following steps:
    extracting reference signal powers of neighboring cells of a current serving cell from the measurement report MR, wherein the neighboring cells of the current serving cell may include all or part of outdoor cells numbered 1, 2, . . . , dm; and assuming that neighboring cell information of the measurement report MR includes information of dn (1≤dn≤dm) outdoor base station transmitting antennas, forming new wireless signal fingerprint information using the received signal strength information of the dn neighboring cells, wherein the new wireless signal fingerprint information may be expressed as E ($E_1$, $E_2$, . . . , $E_{dn}$); and
    selecting cells having same identifiers with the dn neighboring cells from the wireless signal fingerprint database established, and deleting cell identification information and cell wireless signal strength information that do not belong to the dn neighboring cells to form a new wireless signal fingerprint database, wherein each data record of new database records includes the wireless signal strength information of the dn neighboring cells, and the wireless signal fingerprint record the UE can receive at a coordinate of (x, y, z) expressed as Exyz ($E_{xyz1}$, $E_{xyz2}$, ..., $E_{xyzdn}$).

* * * * *